United States Patent
Lin et al.

(10) Patent No.: US 8,962,439 B2
(45) Date of Patent: Feb. 24, 2015

(54) MEMORY CELL

(71) Applicant: Taiwan Semiconductor Manufacturing Company, Ltd., Hsinchu (TW)

(72) Inventors: Jyun-Ying Lin, Wujie Township (TW); Chun-Yao Ko, Hsinchu (TW); Ting-Chen Hsu, Taichung (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 0 days.

(21) Appl. No.: 14/301,443

(22) Filed: Jun. 11, 2014

(65) Prior Publication Data

US 2014/0346655 A1    Nov. 27, 2014

Related U.S. Application Data

(60) Continuation-in-part of application No. 14/151,862, filed on Jan. 10, 2014, now Pat. No. 8,853,079, which is a division of application No. 13/107,409, filed on May 13, 2011, now Pat. No. 8,653,623.

(60) Provisional application No. 61/473,991, filed on Apr. 11, 2011.

(51) Int. Cl.
*H01L 21/20* (2006.01)
*H01L 23/525* (2006.01)

(52) U.S. Cl.
CPC .................. *H01L 23/5256* (2013.01)
USPC .............................. 438/385; 438/682; 257/529

(58) Field of Classification Search
USPC .................... 438/385, 682; 257/529
See application file for complete search history.

(56) References Cited

U.S. PATENT DOCUMENTS 6,661,330 B1    12/2003    Young
2005/0269715 A1    12/2005    Yoo
(Continued)

FOREIGN PATENT DOCUMENTS

CN    1926681    3/2007

OTHER PUBLICATIONS

Sasaki, Takahiko et al., "Melt-Segregrate-Quench Programming of Electrical Fuse", IEEE 05CH37616 43rd Annual International Reliability Physics Symposium, San Jose, CA, 2005, pp. 347-351.

(Continued)

*Primary Examiner* — Bradley K Smith
(74) *Attorney, Agent, or Firm* — Lowe Hauptman & Ham, LLP

(57) ABSTRACT

A method of programming a memory cell includes causing a current to flow through a first silicide-containing portion and a second silicide-containing portion of the memory cell; and causing, by the current, an electron-migration effect to form an extended silicide-containing portion within the gap such that the memory cell is converted from a first state into a second state. The memory cell includes a silicon-containing line continuously extending between a first region and a second region; the first silicide-containing portion over the silicon-containing line and adjacent to the first region; and the second silicide-containing portion over the silicon-containing line and adjacent to the second region. The first silicide-containing portion and the second silicide-containing portion are separated by a gap if the memory cell is at the first state. The extended silicide-containing portion extends from the second silicide-containing portion towards the first silicide-containing portion.

20 Claims, 16 Drawing Sheets

(56) References Cited

U.S. PATENT DOCUMENTS

| | | |
|---|---|---|
| 2008/0277756 A1 | 11/2008 | Min et al. |
| 2009/0108396 A1* | 4/2009 | Chidambarrao et al. ..... 257/529 |
| 2011/0217812 A1 | 9/2011 | Hedler et al. |
| 2012/0044744 A1 | 2/2012 | Chung |
| 2012/0129319 A1* | 5/2012 | Cestero et al. ................ 438/467 |

OTHER PUBLICATIONS

Tian, C. et al., "Reliability Qualification of COSI2 Electrical Fuse for 90NM Technology", IEEE 06CH37728 44th Annual International Reliability Physics Symposium, San Jose, CA, 2006, pp. 392-397.

* cited by examiner

MEMORY CELL

PRIORITY CLAIM

The present application is a continuation-in-part of U.S. application Ser. No. 14/151,862, filed Jan. 10, 2014, which is a divisional of U.S. application Ser. No. 13/107,409, filed May 13, 2011, which claims priority of U.S. Provisional Application No. 61/473,991, filed Apr. 11, 2011, which are incorporated herein by reference in their entireties.

TECHNICAL FIELD

The present disclosure relates generally to the field of semiconductor devices and, more particularly, to a fuse device and methods of forming the same.

BACKGROUND

Various one-time programmable (OTP) devices have been provided and used in the semiconductor industry. The OTP devices can be, for example, mask read only memory (Mask ROM), electrical programmable ROM (EPROM), etc. An e-fuse OTP device uses a fuse element connected to a pull-down transistor. By selectively blowing fuses within an integrated circuit, which has multiple potential uses, a generic integrated circuit design may be economically manufactured and adapted to a variety of customer uses.

Fuses are incorporated in the design of the integrated circuits, and are selectively blown, for example, by passing an electrical current of a sufficient magnitude to cause melting or agglomeration, thereby creating a more resistive path or an open circuit. The process of selectively blowing fuses is referred to as "programming."

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the numbers and dimensions of the various features may be arbitrarily increased or reduced for clarity of discussion.

DETAILED DESCRIPTION

Figure 1:
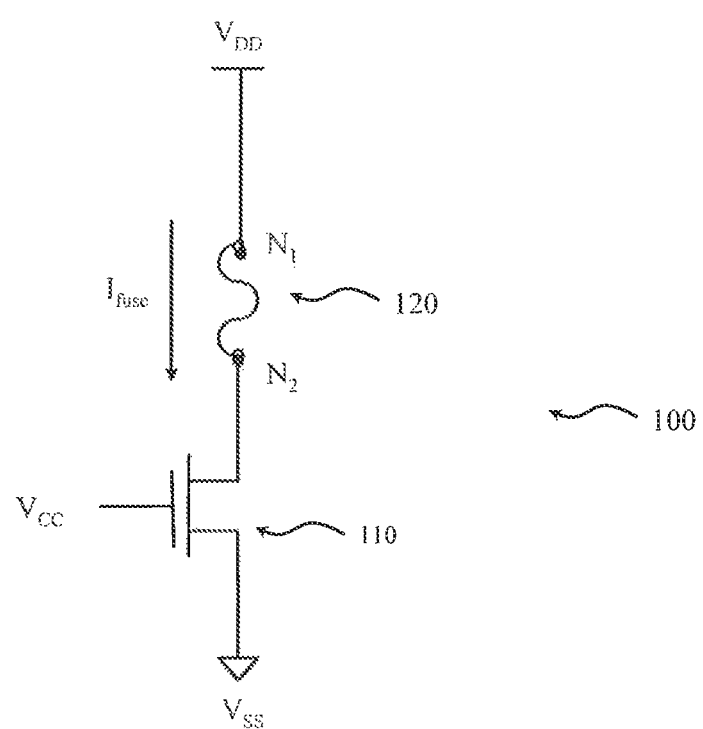
FIG. 1 is a schematic drawing illustrating an exemplary one-time programmable (OTP) device.

An e-fuse OTP device known to the inventors has a fuse element connected to a pull-down transistor. The fuse element has a silicide portion that is disposed on a silicon portion. Both the silicide portion and the silicon portion of the fuse element continuously extend between electrode nodes and are not disrupted before programming.

Applicants found that a high programming current usually is used to program the e-fuse OTP device by blowing out the fuse element. To accommodate the high current, the pull-down transistor that is connected to the fuse element usually has a great width. Due to the high programming current and the large transistor width, the described fuse type OTP device faces obstacles in the shrinking technology nodes and for low-power application. Accordingly, new structures of e-fuse OTP devices are desired.

It is understood that the following descriptions provide many different embodiments, or examples, for implementing different features of the disclosure. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "below," "up," "down," "top," "bottom," etc. as well as derivatives thereof (e.g., "horizontally," "downwardly," "upwardly," etc.) are used for ease of the present disclosure of one feature's relationship to another feature. The spatially relative terms are intended to cover different orientations of the device including the features.

FIG. 1 is a schematic drawing illustrating an exemplary one-time programmable (OTP) device. In FIG. 1, an OTP device 100 includes at least one transistor, e.g., a transistor 110, and a fuse 120. The transistor 110 is electrically coupled with the fuse 120 in series between power voltages $V_{ss}$ and $V_{DD}$. In some embodiments, a node $N_1$ is between the fuse 120 and the power voltage $V_{DD}$. A node $N_2$ is between the fuse 120 and the transistor 110. In some embodiments, the transistor 110 can be an N-type metal-oxide-semiconductor (MOS) transistor, a P-type transistor, other transistor devices, and/or any combinations thereof. In other embodiments, the transistor 110 can be referred to as a pull-down transistor.

In some embodiments programming the OTP device 100 to a logic "0" state, the transistor 110 is turned off such that no substantial current flows through the fuse 120 and the fuse 120 is intact. In other embodiments programming the OTP device 100 to a logic "1" state, a voltage $V_{cc}$ is applied to the gate of the transistor 110 so as to turn on the transistor 110. The turned-on transistor 110 electrically couples the power voltage $V_{ss}$ and the node $N_2$, such that a fuse current $I_{fuse}$ flows through both the transistor 110 and the fuse 120. The fuse current $I_{fuse}$ can blow out the fuse 120, such that the resistance of the fuse 120 increases by a tremendous magnitude.

Figure 2A:
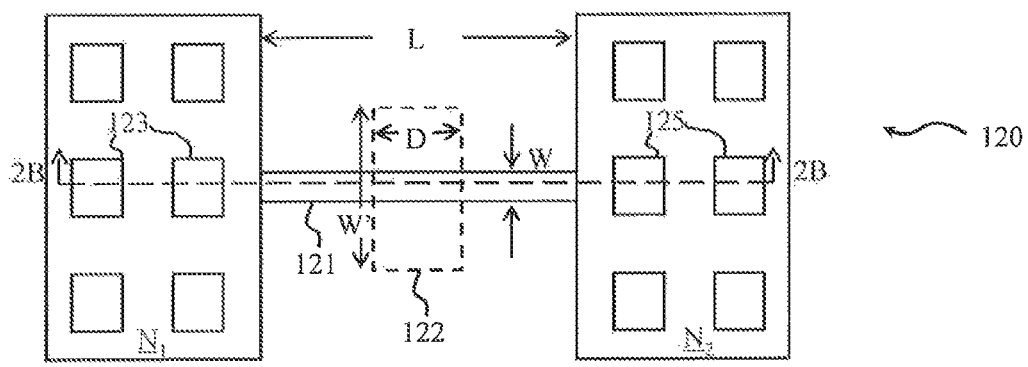
FIG. 2A is a schematic top view showing an exemplary fuse of the OTP device.
Figure 2B:
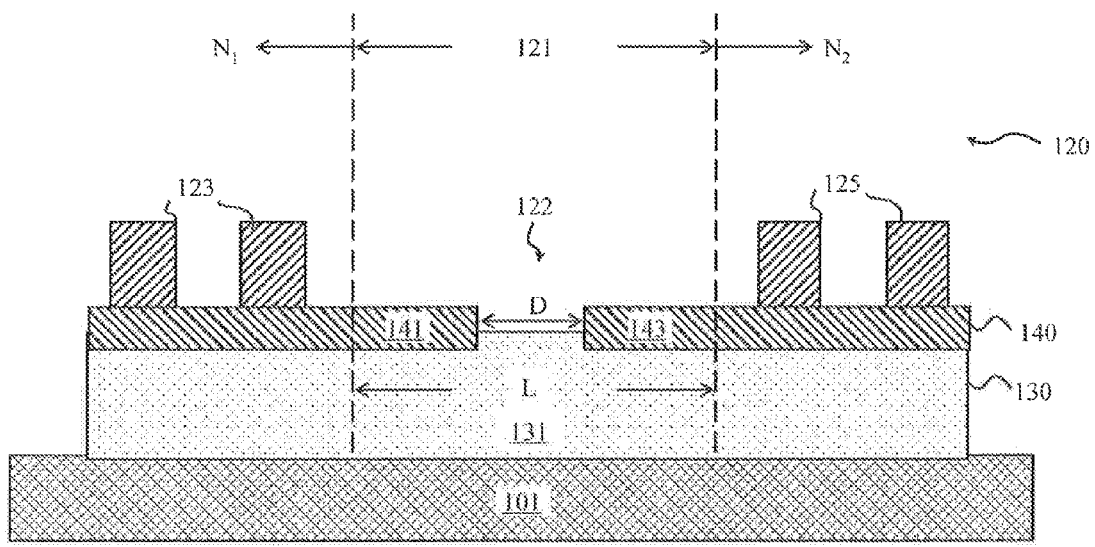
FIG. 2B is a schematic cross-sectional view of the exemplary fuse taken along a section line 2B-2B of FIG. 2A.

FIG. 2A is a schematic top view showing an exemplary fuse of the OTP device. FIG. 2B is a schematic cross-sectional view of the exemplary fuse taken along a section line 2B-2B of FIG. 2A. In FIGS. 2A-2B, the fuse 120 includes a fuse line 121 that is disposed between the nodes $N_1$ and $N_2$. In some embodiments, the fuse line 121 can be disposed over a substrate 101 as shown in FIG. 2B. In other embodiments, the fuse line 121 can be disposed over an isolation structure (not shown) that is disposed over the top surface of the substrate 101. The isolation structure can include a shallow trench isolation (STI) structure and/or a local oxidation of silicon (LOCOS) structure.

In some embodiments, the substrate 101 can include an elementary semiconductor including silicon or germanium in a crystal, a polycrystalline, or an amorphous structure; a compound semiconductor including silicon carbide, gallium arsenic, gallium phosphide, indium phosphide, indium arsenide, and indium antimonide; an alloy semiconductor including SiGe, GaAsP, AlInAs, AlGaAs, GaInAs, GaInP, and GaInAsP; any other suitable material; or combinations thereof. In one embodiment, the alloy semiconductor substrate may have a gradient SiGe feature in which the Si and Ge composition change from one ratio at one location to another ratio at another location of the gradient SiGe feature. In another embodiment, the alloy SiGe is formed over a silicon substrate. In another embodiment, a SiGe substrate is strained. Furthermore, the semiconductor substrate may be a semiconductor on insulator, such as a silicon on insulator (SOI), or a thin film transistor (TFT).

Referring to FIGS. 2A-2B, the fuse 120 can include a silicon-containing line 131 that is disposed over the substrate 101. In some embodiments, the silicon-containing line 131 is a portion of a silicon-containing layer 130. The silicon-containing line 131 continuously extends between the nodes $N_1$ and $N_2$ of the fuse 120 for electrical connection therebetween. In some embodiments, the silicon-containing line 131 can have a length L and a width that is substantially equal to a width W of the fuse line 121 as shown in FIG. 2A. The silicon-containing line 131 can be made of at least one material, such as polysilicon, amorphous silicon, silicon-germanium, other silicon-containing materials having a resistance that is substantially different from a silicide material, and/or any combinations thereof.

Referring to FIG. 2B, the fuse 120 can include silicide-containing portions 141 and 143 that are disposed over the silicon-containing line 131. The silicide-containing portions 141 and 143 can be portions of a silicide-containing layer 140. The silicide-containing portions 141 and 143 are separated from each other by a predetermined distance D of a region 122. In some embodiments, the distance D is substantially equal to or less than the length L of the silicon-containing line 131. In other embodiments, the distance D is about 50% or less of the length L of the silicon-containing line 131. In still other embodiments, the distance D is about 40% or less of the length L of the silicon-containing line 131. In some embodiments, the silicide-containing portions 141 and 143 can be made of at least one silicide material, such as titanium silicide, cobalt silicide, nickel silicide, other silicide materials having a resistance that is substantially lower than a silicon-containing material, and/or any combinations thereof.

Referring again to FIGS. 2A and 2B, contact regions 123 and 125 can be disposed over the silicide-containing layer 140 in the nodes $N_1$ and $N_2$, respectively, for electrical connections. In some embodiments, the contact regions 123 and 125 can be made of at least one conductive material, such as such as tungsten, aluminum, copper, titanium, tantalum, other proper conductive materials, and/or combinations thereof.

Figure 2C:
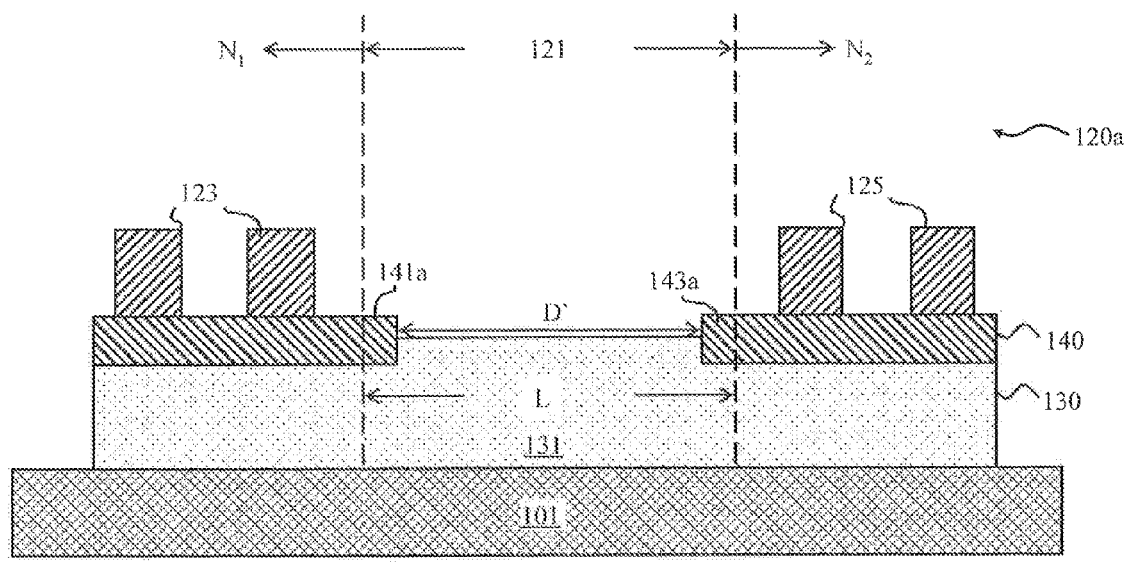
FIG. 2C is a schematic cross-sectional view of the exemplary fuse after programming.
Figure 2D:
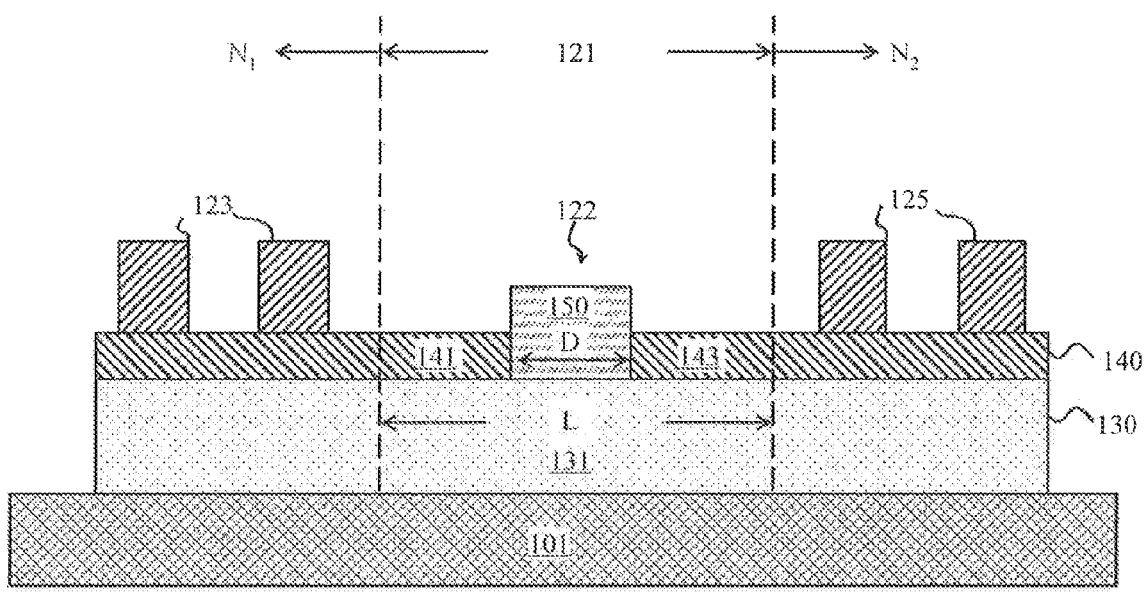
FIG. 2D is a schematic cross-sectional view of another exemplary fuse.

In some embodiments, a dielectric material can be disposed between the silicide-containing portions 141 and 143. For example, a dielectric material 150 can be disposed in the region 122 between the silicide-containing portions 141 and 143 as shown in FIG. 2D. The dielectric material 150 can be made of at least one dielectric material, such as silicon oxide, silicon nitride, silicon oxynitride, silicon carbide, silicon oxycarbide, silicon carbon nitride, other dielectric materials, and/or any combinations thereof. In some embodiments, the dielectric material 150 is thicker than each of the silicide-containing portions 141 and 143. In other embodiments, the dielectric material 150 can include a region at least the same length as or larger than the region 122 as shown in FIG. 2A. In at least this embodiment, the width W' of the dielectric material 150 is larger than the width W of each of the silicide-containing portions 141 and 143. In still other embodiments, the dielectric material 150 can be referred to as a resistance protection oxide (RPO) layer.

Figure 2E:
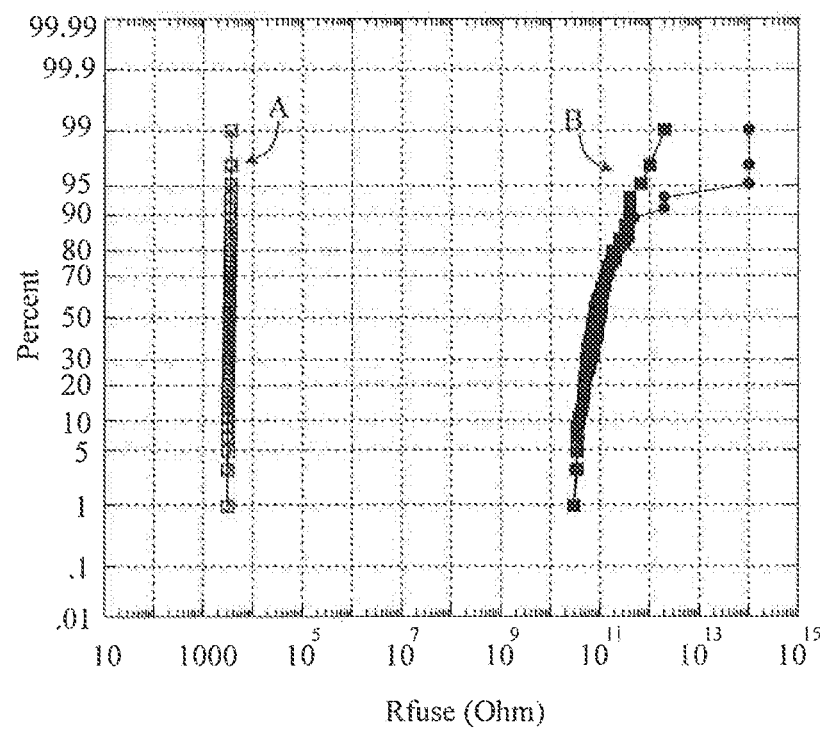
FIG. 2E is an experimental result showing resistance distributions of fuses before and after programming.

For example, a 0.15-μm technology node is adopted to form the OTP device 100. The width W of the fuse 120 can be around 0.15 μm. The length L of the fuse 120 can be around 1.33 μm. The distance D between the silicide-containing portions 141 and 143 can be around 0.43 μm. The resistance of the undisrupted fuse 120 can be around 4 KΩ as indicated by resistance "A" in FIG. 2E.

To blow out the fuse 120, the transistor 110 is turned on. The fuse current $I_{fuse}$, e.g., about 1.5 mA can migrate atoms of the silicide-containing portions 141, 143 and/or the silicon-containing line 131, such that the silicide-containing portions 141a and 143a of the blown-out fuse 120a are further separated from each other as shown in FIG. 2C. The distance D' between the silicide-containing portions 141a and 143a is larger than the distance D shown in FIG. 2B. The resistance of the blown-out fuse 120a can be larger than that of the undisrupted fuse 120 by around 6-7 orders of magnitude as indicated by resistance "B" in FIG. 2E. With the huge resistance difference of the undisrupted fuse 120 and the blown-out fuse 120a, the logic states are programmed into various OTP devices.

As noted, the intact fuse 120 has the silicide-containing portions 141 and 143 that are separated by the predetermined distance D or the dielectric material 150. With the discontinuity of the silicide-containing portions 141 and 143, the fuse 120 has a resistance that is substantially higher than a resistance of a fuse structure known to the inventors that has an undisrupted silicide line, e.g., 4 KΩ to 100Ω, respectively.

It is also noted that a high current, e.g., about 35 mA, may be applied to generate a sufficient heat to blow out the low resistance fuse structure previously known to the inventors. To accommodate such a great current, a pull-down transistor that is connected to the low resistance fuse usually has a large width, e.g., about 60 μm. Due to the high programming current and large transistor width, the fuse type OTP known to the inventors faces obstacles in shrinking technology nodes and for low-power application.

Substantially different from the low resistance fuse structure, the fuse 120 has a resistance, e.g., about 4 kΩ that is substantially higher than the resistance, e.g., about 100Ω of the conventional fuse element. The high resistance of the fuse 120 can be utilized in conjunction with a low programming current, e.g., 1.5 mA, to generate a desired heat to blow out the fuse 120. As the low current is applied, the size of the transistor 110 can be substantially scaled down to, for example, a tenth of the width of the fuse element known to the inventors. From the foregoing, the cell size of the OTP device 100, compared with the cell size of the conventional OTP device, can be reduced by around 70%. The OTP device 100 can be used in a high-density application without sacrificing area of an integrated circuit. The programming current of the OTP device 100 can also be reduced by around 95%. Due to the low programming current, the OTP device 100 can be applied in a low-power product.

It is noted that the resistances and/or programming currents described above are merely exemplary and may vary depending on changes of the technology node applied for forming the OTP device. In some embodiments, the programming current or the fuse current can be about 10 mA or less. In other embodiments, the programming current or the fuse current can be about 3 mA or less.

Figure 3:
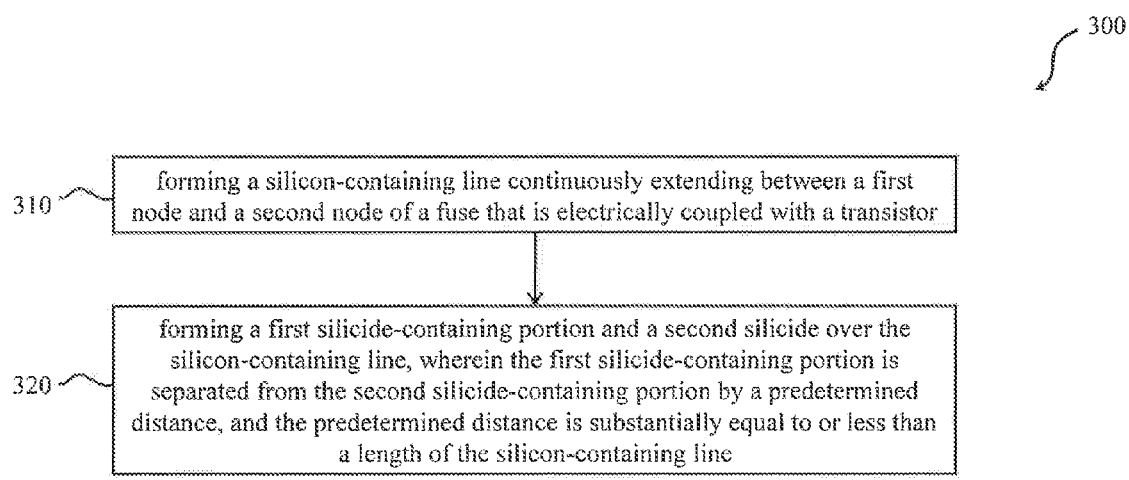
FIG. 3 is a flowchart of an exemplary method of forming an OTP device.
Figure 4A:
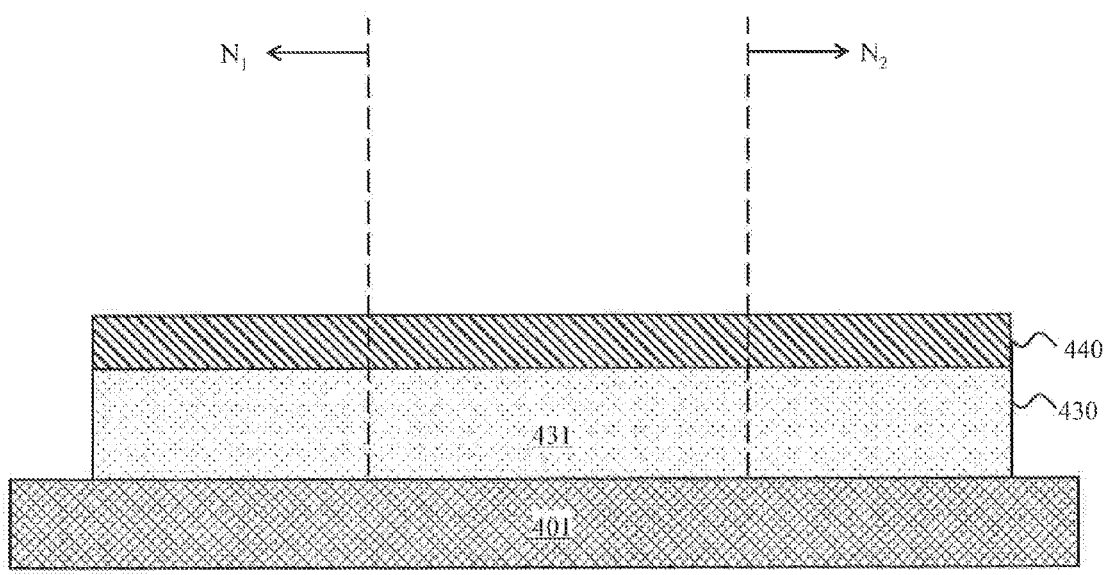
FIGS. 4A-4C are schematic cross-sectional views of the OTP device during various fabrication stages of a first exemplary method.
Figure 4B:
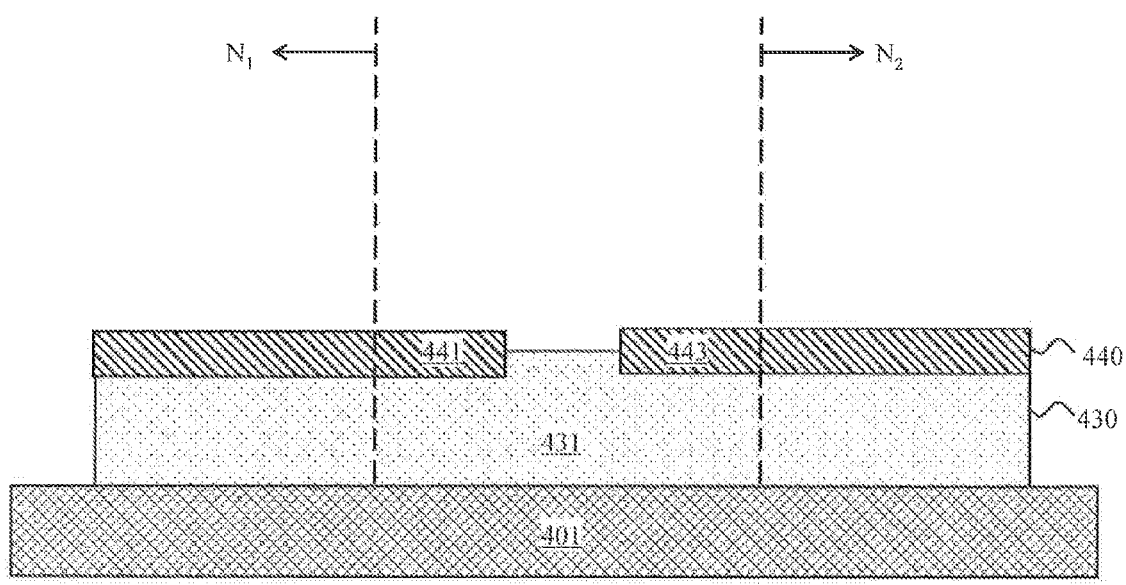
Figure 4C:
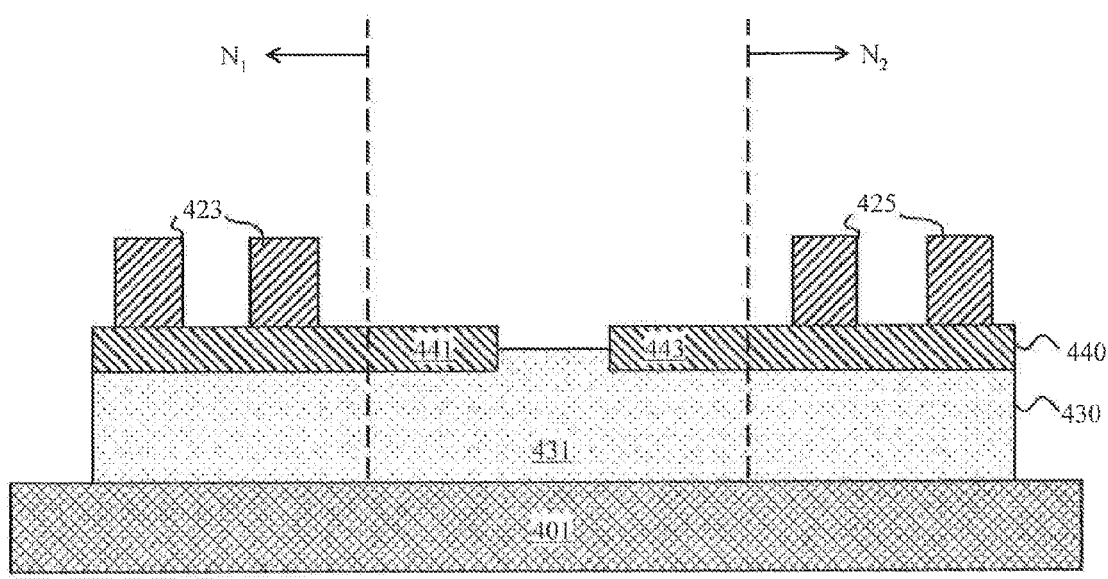
Figure 5A:
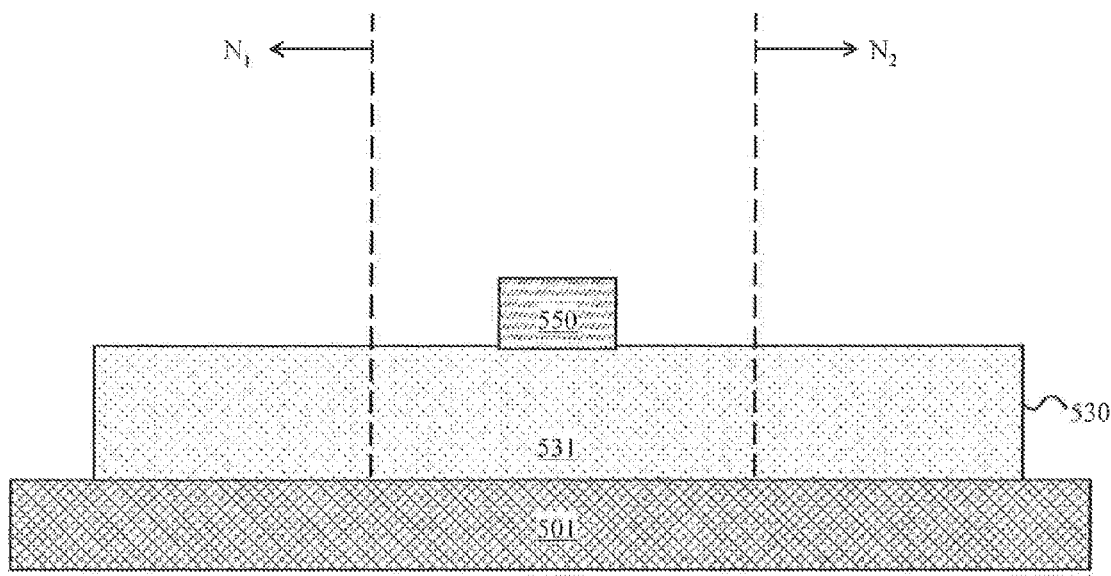
FIGS. 5A-5C are schematic cross-sectional views of the OTP device during various fabrication stages of a second exemplary method.
Figure 5B:
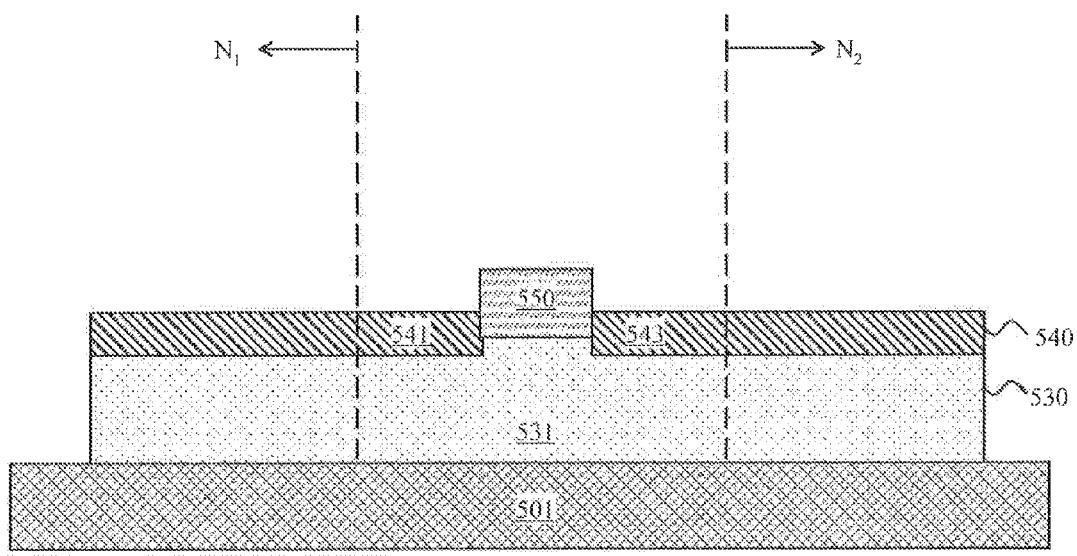
Figure 5C:
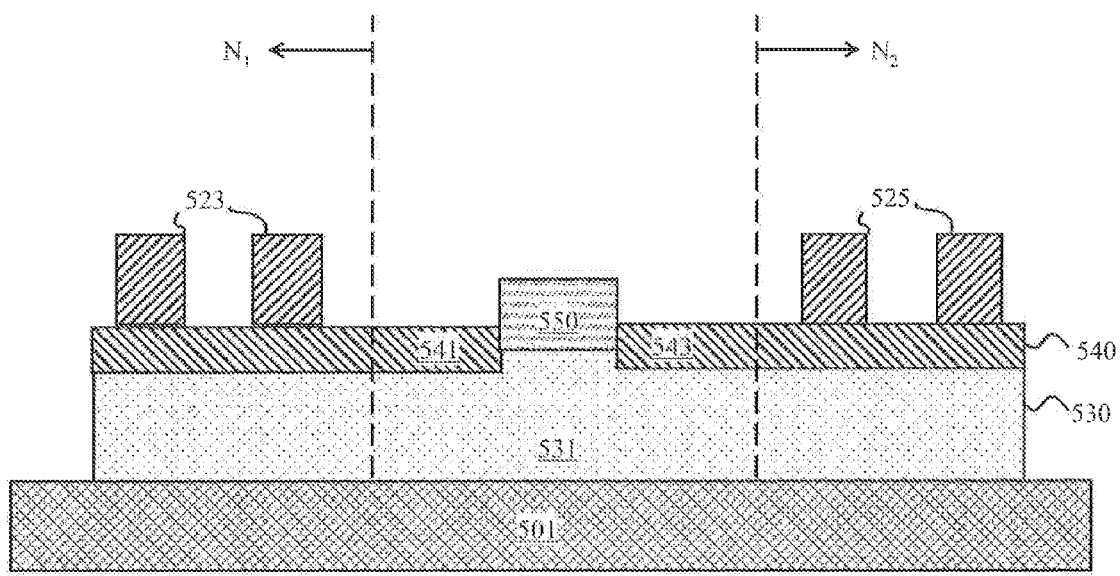

FIG. 3 is a flowchart of an exemplary method of forming an OTP device. FIGS. 4A-4C are schematic cross-sectional views of the OTP device during various fabrication stages of a first exemplary method. FIGS. 5A-5C are schematic cross-sectional views of the OTP device during various fabrication stages of a second exemplary method. Items of FIGS. 4A-4C and 5A-5C that are the same or similar items in FIGS. 2B and 2D are indicated by the same reference numerals, increased by 300 and 400, respectively. It is understood that methods of FIGS. 3, 4A-4C and 5A-5C have been simplified for a better understanding of the concepts of the present disclosure. Accordingly, it should be noted that additional processes may be provided before, during, and after the methods of FIGS. 3, 4A-4C and/or 5A-5C, and that some other processes may only be briefly described herein.

Referring to FIG. 3, a method 300 of forming an OTP device includes forming a silicon-containing line continuously extending between a first node and a second node of a fuse that is electrically coupled with a transistor (block 310). The method 300 also includes forming a first silicide-containing portion and a second silicide over the silicon-containing line, wherein the first silicide-containing portion is separated from the second silicide-containing portion by a predetermined distance, and the predetermined distance is substantially equal to or less than a length of the silicon-containing line (block 320).

For example, a silicon-containing layer 430 can be formed over a substrate 401. The silicon-containing layer 430 can include a region referred to as a silicon-containing line 431. The silicon-containing line 431 can continuously extend between the nodes $N_1$ and $N_2$. The silicon-containing layer 430 can be formed by any suitable process, such as atomic layer deposition (ALD), chemical vapor deposition (CVD), remote plasma CVD (RPCVD), plasma enhanced CVD (PECVD), metal organic CVD (MOCVD), other suitable processes, and/or any combinations thereof.

Referring to FIG. 4A, a silicide-containing layer 440 can be formed and continuously extend over the silicon-containing layer 430. In some embodiments, a metallic material that is utilized to form the silicide-containing layer 440 can be deposited over the silicon-containing layer 430 by using physical vapor deposition (PVD) such as sputtering and evaporation; plating; chemical vapor deposition (CVD) such as plasma enhanced CVD (PECVD), atmospheric pressure CVD (APCVD), low pressure CVD (LPCVD), high density plasma CVD (HDPCVD) and atomic layer CVD (ALCVD); other suitable deposition processes; and/or combinations thereof. After the deposition, the salicidation process may continue with a reaction between the deposited metallic material and the top portion of the silicon-containing layer 430 at an elevated temperature that is selected based on the specific material or materials. This is also referred to as annealing, which may include a rapid thermal process (RTP). The reacted silicide may be formed by a one-step RTP or multiple-step RTPs. After the salicidation process, the non-reacted metallic material is removed.

Referring to FIG. 4B, a portion of the silicide-containing layer 440 is removed so as to form silicide-containing portions 441 and 443 over the silicon-containing line 411. In some embodiments, the removal process can include forming a patterned mask layer (not shown) covering the silicide-containing portions 441 and 443 of the silicide-containing layer 440. An etching process then removes the portion of the silicide-containing layer 440 that is not covered by the patterned mask layer. After the removal of the portion of the silicide-containing layer 440, the patterned mask layer is removed and the structure shown in FIG. 4B is achieved.

Referring to FIG. 4C, contact regions 423 and 425 can be formed within the nodes $N_1$ and $N_2$, respectively. The contact regions 423 and 425 can be formed by, for example, physical vapor deposition (PVD) such as sputtering and evaporation; plating; chemical vapor deposition (CVD) such as plasma enhanced CVD (PECVD), atmospheric pressure CVD (APCVD), low pressure CVD (LPCVD), high density plasma CVD (HDPCVD) and atomic layer CVD (ALCVD); other suitable deposition processes; and/or combinations thereof.

In some embodiments, the method 300 can optionally include forming a dielectric material between the first and second silicide-containing portions. For example, after the formation of a silicon-containing layer 530 over a substrate 501, a dielectric material 550 can be formed over a silicon-containing line 531 of the silicon-containing layer 530 as shown in FIG. 5A.

Referring to FIG. 5B, a metallic material (not shown) that is utilized to form a silicide-containing layer 540 can be formed over the silicon-containing layer 530 and the dielectric material 550. After the deposition, the salicidation process may continue with a reaction between the deposited metallic material and the top portion of the silicon-containing layer 530 at an elevated temperature that is selected based on the specific material or materials. As the dielectric material 550 covers a top region of the silicon-containing layer 531, the covered region of the silicon-containing layer 531 is free from being reacted with the metallic material to form a silicide region. After the salicidation process, a portion of the metallic material that is disposed over the dielectric material 550 and does not react with the silicon-containing line 530 is removed. As shown in FIG. 5B, the dielectric material 550 is formed between and separates the silicide-containing portions 541 and 543.

Referring to FIG. 5C, contact regions 523 and 525 can be formed within the nodes $N_1$ and $N_2$, respectively. The contact regions 523 and 525 can be formed by, for example, physical vapor deposition (PVD) such as sputtering and evaporation; plating; chemical vapor deposition (CVD) such as plasma enhanced CVD (PECVD), atmospheric pressure CVD (APCVD), low pressure CVD (LPCVD), high density plasma CVD (HDPCVD) and atomic layer CVD (ALCVD); other suitable deposition processes; and/or combinations thereof.

In a first exemplary embodiment of this application, a one-time programmable (OTP) device includes at least one transistor that is electrically coupled with a fuse. The fuse includes a silicon-containing line continuously extending between a first node and a second node of the fuse. A first silicide-containing portion is disposed over the silicon-containing line. A second silicide-containing portion is disposed over the silicon-containing line. The second silicide-containing portion is separated from the first silicide-containing portion by a predetermined distance. The predetermined distance is substantially equal to or less than a length of the silicon-containing line.

In a second exemplary embodiment of this application, a method of forming a one-time programmable (OTP) device includes a silicon-containing line continuously extending between a first node and a second node of a fuse that is electrically coupled with a transistor. A first silicide-containing portion and a second silicide are formed over the silicon-containing line, wherein the first silicide-containing portion is separated from the second silicide-containing portion by a predetermined distance, and the predetermined distance is substantially equal to or less than a length of the silicon-containing line.

Figure 6A:
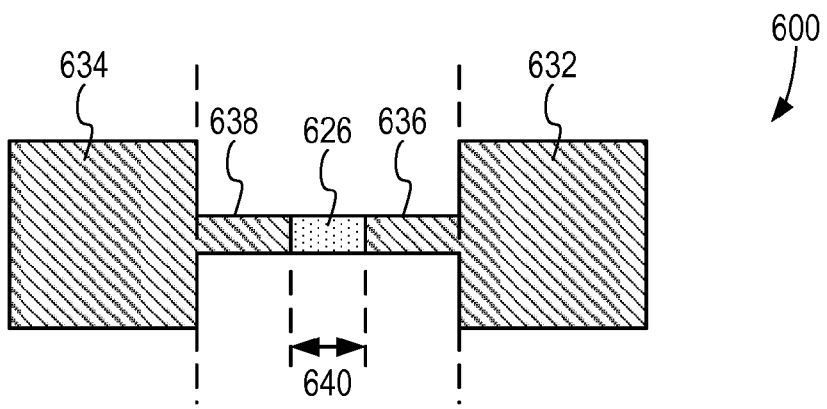
FIG. 6A is a top view of a memory cell in accordance with some embodiments.
Figure 6B:
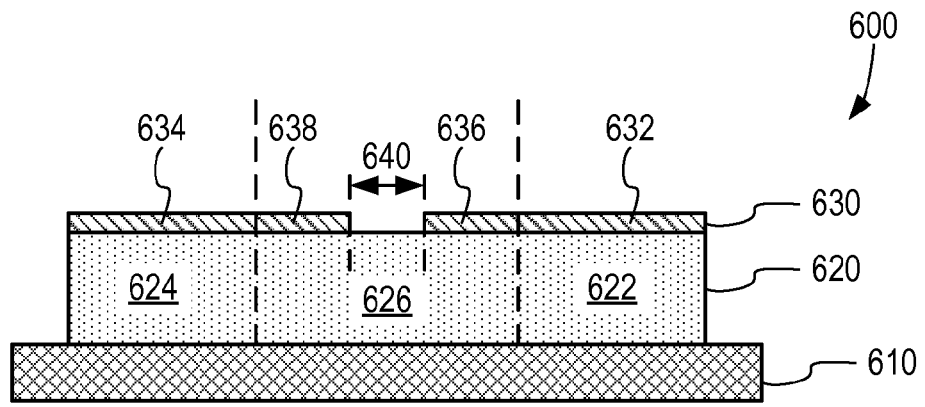
FIGS. 6B and 6C are cross-sectional views of the memory cell depicted in FIG. 6A at different resistance states in accordance with some embodiments.
Figure 6C:
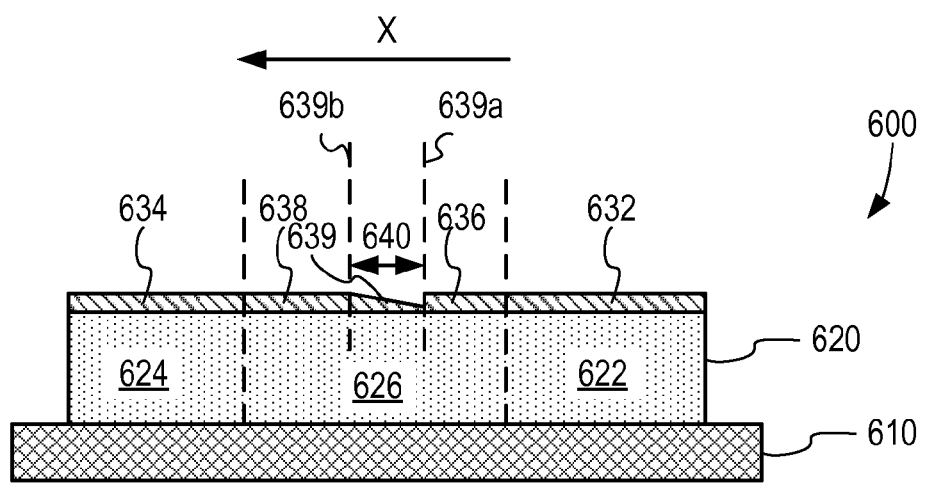

FIG. 6A is a top view of a memory cell 600 at a high resistance state in accordance with some embodiments. FIG. 6B is a cross-sectional view of memory cell 600 at the high resistance state in accordance with some embodiments. FIG. 6C is a cross-sectional view of memory cell 600 at a low resistance state in accordance with some embodiments.

Memory cell 600 includes a substrate 610, a silicon-containing layer 620 over substrate 610, and a silicide-containing portion 630 over silicon-containing layer 620. Silicon-containing layer 620 including a first region 622, a second region 624, and a silicon-containing line 626 connecting first region 622 and second region 624. Silicide-containing portion 630 includes a first node portion 632 over first region 622, a second node portion 634 over first region 624, and a first silicide-containing portion 636 and a second silicide-containing portion 638 over silicon-containing line 626. First silicide-containing portion 636 is separated from second silicide-containing portion 638 by a gap 640.

In some embodiments, substrate 610 corresponds to substrate 101, 401, or 501; silicon-containing layer 620 corresponds to silicon-containing layer 130, 430, or 530; first silicide-containing portion 636 corresponds to silicide-containing portion 141, 441, or 541; and second silicide-containing portion 638 corresponds to silicide-containing portion 143, 443, or 543. Detailed description of these components is thus simplified or omitted.

If memory cell 600 is at the high resistance state as depicted in FIG. 6C, memory cell 600 further includes an extended silicide-containing portion 639 within gap 640. Extended silicide-containing portion 639 extends from second silicide-containing portion 638 towards first silicide-containing portion 636 if programming current applied thereon flows along a direction X from first silicide-containing portion 636 to second silicide-containing portion 638.

Extended silicide-containing portion 639 has a first end 639a having a first thickness and a second end 639b having a second thickness, second end 639b is closer to second silicide-containing portion 638 than first end 639a, and the first thickness is thinner than the second thickness.

In some embodiments, extended silicide-containing portion 639 is formed by causing an electron-migration effect to move a portion of the silicide material from second silicide-containing portion 638 to gap 640. In some embodiments, second silicide-containing portion 638 has sufficient silicide material to supply the formation of extended silicide-containing portion 639 and to keep second silicide-containing portion 638 covering substantially the same portion of silicon-containing layer 620 prior to the formation of extended silicide-containing portion 639.

In some embodiments, memory cell 600 is converted from the high resistance state as depicted in FIG. 6B to the low resistance state as depicted in FIG. 6C by causing a current to flow through first silicide-containing portion 636 and second silicide-containing portion 638. In some embodiments, a current level of the current is less than 0.6 mA. In some embodiments, the current is applied for a predetermined time period greater than 10 ms if the current has a current level less than 0.6 mA.

In some embodiments, if memory cell 600 is at the high resistance state as depicted in FIGS. 6A and 6B, first silicide-containing portion 636 and second silicide-containing portion 638 have a first resistance value therebetween if extended silicide-containing portion 639 is absent. In some embodiments, if memory cell 600 is at the low resistance state as depicted in FIG. 6C, first silicide-containing portion 636 and second silicide-containing portion 638 have a second resistance value therebetween if extended silicide-containing portion 639 exists. In some embodiments, a ratio of the first resistance value to the second resistance value is greater than a predetermined number. In some embodiments, the predetermined number of the ratio is greater than 30. In some embodiments, the first resistance value ranges from 2000Ω to 5000Ω. In some embodiments, the second resistance value is less than 100 Ω.

Figure 7:
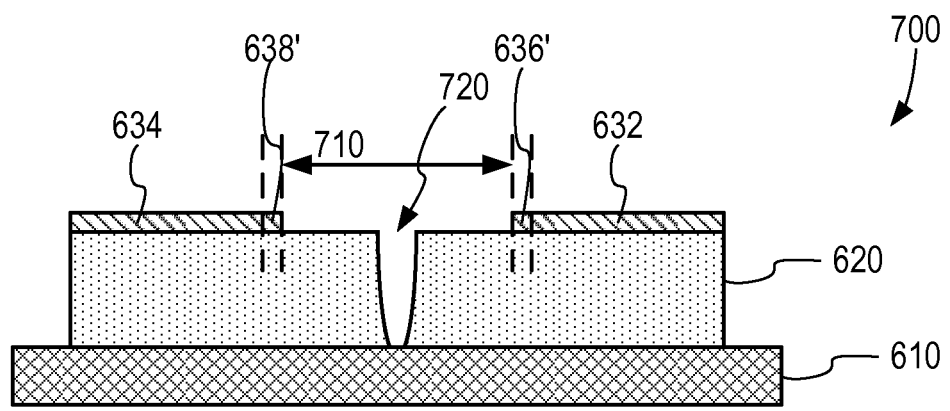
FIG. 7 is a cross-sectional view of a memory cell programmed according to a method as illustrated in conjunction with FIGS. 2B-2C.

FIG. 7 is a cross-sectional view of a memory cell 700 programmed according to a method as illustrated in conjunction with FIGS. 2B-2C. Components in FIG. 7 that are the same or similar to those in FIGS. 6A-6C are given the same reference numbers, and detailed description thereof is thus omitted.

Memory cell 700 is at a burned-out state. Compared with memory cell 600 in FIG. 6B, first silicide-containing portion 636 and second silicide-containing portion 638 are partially removed to become portions 636' and 638' due to the heat caused by a current, and thus the gap 640 is expanded into a region 710. Also, a rupture 720 in silicon-containing layer 620 is formed also due to the heat caused by the current.

In some embodiments, memory cell 700 is converted from the high resistance state as depicted in FIG. 6B to the burned-out state as depicted in FIG. 7 by causing the current to flow through first silicide-containing portion 636 and second silicide-containing portion 638. In some embodiments, a current level of the current is greater than 1.0 mA. In some embodiments, the current is applied for a predetermined time period less than 30 µs if the current has a current level greater than 1.0 mA. In some embodiments, the current level is about 1.5 mA, and the predetermined time period is about 20 µs.

In contrast, the current level and time period for converting memory cell 600 from the high resistance state as depicted in FIG. 6B to the low residence state as depicted in FIG. 6C is set to be insufficient to cause the rupture 720 in silicon-containing layer 620 and/or the expansion of gap 640 in FIG. 6B into a region 710 in FIG. 7.

Figure 8:
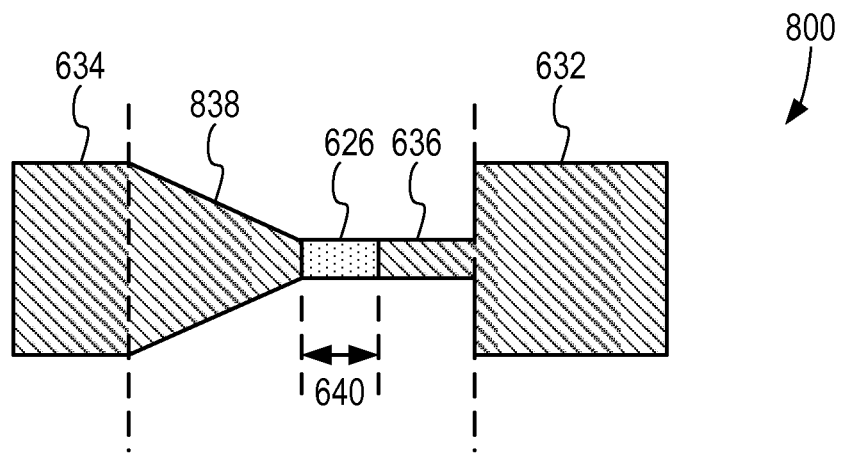
FIG. 8 is a top view of another memory cell 800 in accordance with some embodiments.

FIG. 8 is a top view of another memory cell 800 in accordance with some embodiments. Components in FIG. 8 that are the same or similar to those in FIGS. 6A-6C are given the same reference numbers, and detailed description thereof is omitted.

Compared with memory cell 600, memory cell 800 has a tapered second silicide-containing portion 838 instead of silicide-containing portion 638. Tapered second silicide-containing portion 838 has tapered sidewalls. In some embodiments, the tapered second silicide-containing portion 838 is replaced with another silicide-containing portion having a different shape. In some embodiments, the another silicide-containing portion has a first end having a first width and a second end having a second width. The second end is closer to the second node portion 634 than the first end, and the first width is less than the second width.

Figure 9:
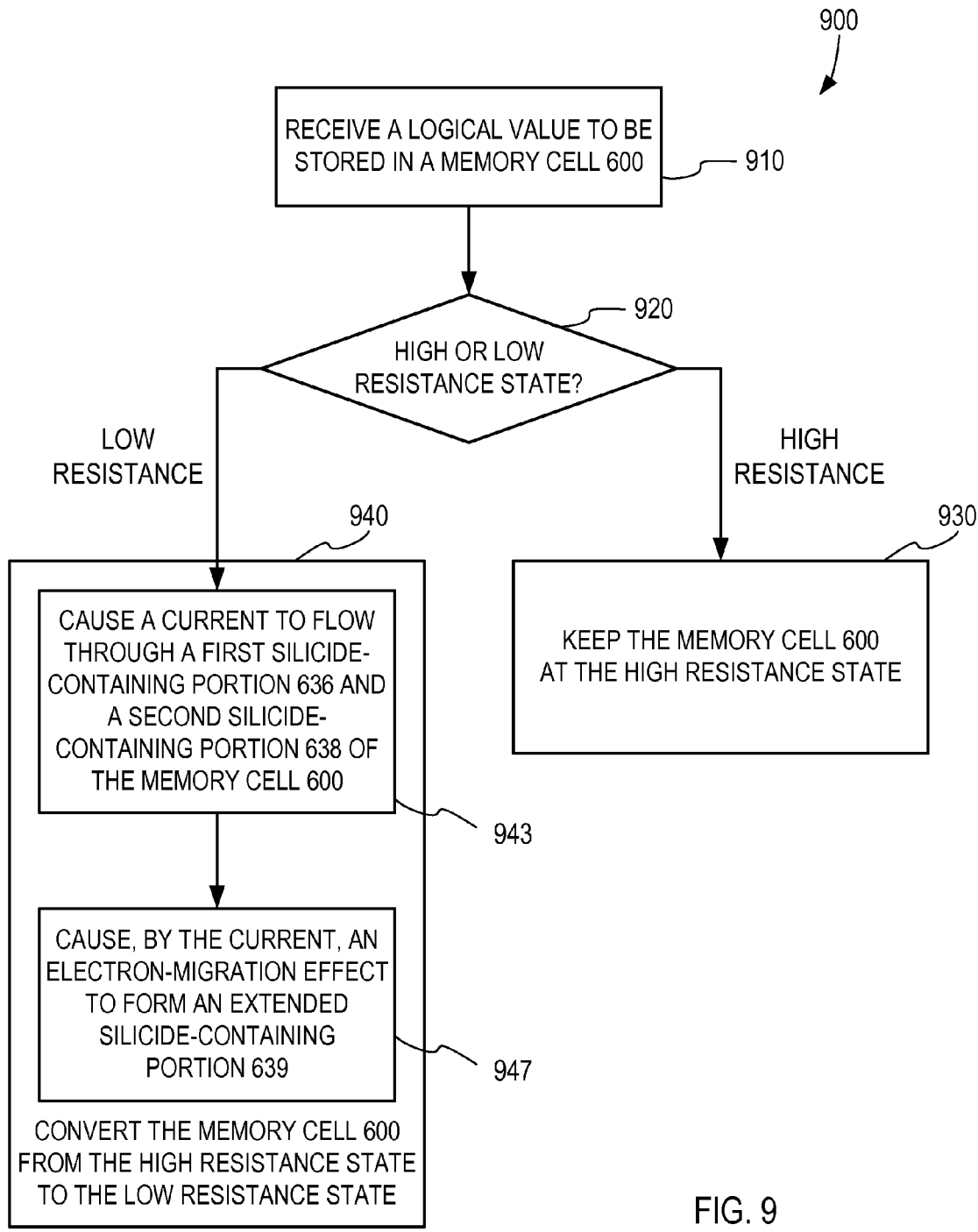
FIG. 9 is a flowchart of a method of programming a memory cell in accordance with some embodiments.

FIG. 9 is a flowchart of a method 900 of programming a memory cell in accordance with some embodiments. In some embodiments, method 900 of programming a memory cell the same or similar to memory cell 600 illustrated in conjunction with FIGS. 6A-6C. It is understood that additional operations may be performed before, during, and/or after the method 900 depicted in FIG. 9, and that some other processes may only be briefly described herein.

The method 900 starts with operation 910, where a controller receives a logical value to be stored in a memory cell 600. The method 900 proceeds to operation 920, where the controller determines if memory cell 600 is to be programmed to a low resistance state or remains at a high resistance state. If it is determined that memory cell 600 remains at the high resistance state, the method 900 proceeds to operation 930, where memory cell 600 is kept at the high resistance state. If it is determined that memory cell 600 is to be converted to the low resistance state, the method 900 proceeds to operation 940, where memory cell 600 is converted from the high resistance state to the low resistance state.

Operation 940 includes operations 943 and 947. In operation 943, a current is caused to flow through first silicide-containing portion 636 and second silicide-containing portion 638 of the memory cell 600. Thus, electrons are driven to move from second silicide-containing portion 638 toward first silicide-containing portion 636. As a result, in operation 947, an electron-migration effect is caused by the current to form extended silicide-containing portion 639. In some embodiments, a current level of the current is less than 0.6 mA. In some embodiments, the current is applied for a pre-determined time period greater than 10 ms if the current has a current level less than 0.6 mA.

In accordance with one embodiment, A method of programming a memory cell includes causing a current to flow through a first silicide-containing portion and a second silicide-containing portion of the memory cell; and causing, by the current, an electron-migration effect to form an extended silicide-containing portion within the gap such that the memory cell is converted from a first state into a second state. The memory cell includes a silicon-containing line continuously extending between a first region and a second region; the first silicide-containing portion over the silicon-containing line and adjacent to the first region; and the second silicide-containing portion over the silicon-containing line and adjacent to the second region. The first silicide-containing portion and the second silicide-containing portion are separated by a gap if the memory cell is at the first state. The extended silicide-containing portion extends from the second silicide-containing portion towards the first silicide-containing portion.

In accordance with another embodiment, a memory cell includes a substrate, a silicon-containing layer over the substrate, a first silicide-containing portion and a second silicide-containing portion over the silicon-containing line, and an extended silicide-containing portion. The silicon-containing layer includes a first region, a second region, and a silicon-containing line connecting the first region and the second region. The first silicide-containing portion is separated from the second silicide-containing portion by a gap. The extended silicide-containing portion is within the gap and extends from the second silicide-containing portion towards the first silicide-containing portion. The extended silicide-containing portion has a first end having a first thickness and a second end having a second thickness, where the second end of the extended silicide-containing portion is closer to the second silicide-containing portion than the first end of the extended silicide-containing portion. The first thickness is thinner than the second thickness.

In accordance with another embodiment, a method of programming a memory cell includes if the memory cell is to store a first logical value, converting the memory cell from a high resistance state to a low resistance state; and if the memory cell is to store a second logical value, keeping the memory cell at the high resistance state. The memory cell includes a silicon-containing line continuously extending between a first region and a second region; a first silicide-containing portion over the silicon-containing line and adjacent to the first region; and a second silicide-containing portion over the silicon-containing line and adjacent to the second region. The first silicide-containing portion and the second silicide-containing portion are separated by a gap. The high resistance state corresponds to a first resistance value between the first silicide-containing portion and the second silicide-containing portion. The low resistance state corresponds to a second resistance value between the first silicide-containing portion and the second silicide-containing portion. The first resistance value is greater than the second resistance value.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of programming a memory cell, the method comprising:
   causing a current to flow through a first silicide-containing portion and a second silicide-containing portion of the memory cell, the memory cell comprising:
   a silicon-containing line continuously extending between a first region and a second region;
   the first silicide-containing portion over the silicon-containing line and adjacent to the first region; and
   the second silicide-containing portion over the silicon-containing line and adjacent to the second region, the first silicide-containing portion and the second silicide-containing portion being separated by a gap if the memory cell is at a first state; and
   causing, by the current, an electron-migration effect to form an extended silicide-containing portion within the gap such that the memory cell is converted into a second state, the extended silicide-containing portion extending from the second silicide-containing portion towards the first silicide-containing portion.

2. The method of claim 1, wherein the current is set to have a current level insufficient to cause rupture of the silicon-containing line.

3. The method of claim 1, wherein the current level is less than 0.6 mA.

4. The method of claim 1, wherein the causing the current to pass through the first silicide-containing portion and the second silicide-containing portion is performed for a predetermined period of time.

5. The method of claim 4, wherein the predetermined time period is greater than 10 ms.

6. The method of claim 1, wherein
the memory cell has a first resistance value between the first silicide-containing portion and the second silicide-containing portion if the memory cell is at the first state;
the memory cell has a second resistance value between the first silicide-containing portion and the second silicide-containing portion if the memory cell is at the second state, the second resistance value being less than the first resistance value; and
the causing the current to pass through the first silicide-containing portion and the second silicide-containing portion is performed for a predetermined time period sufficient to cause a ratio of the first resistance value to the second resistance value to be greater than a predetermined number.

7. The method of claim 5, wherein the predetermined number of the ratio is greater than 30.

8. The method of claim 5, wherein the first resistance value ranges from $2000\Omega$ to $5000\Omega$.

9. A memory cell, comprising:
a substrate;
a silicon-containing layer over the substrate, the silicon-containing layer including a first region, a second region, and a silicon-containing line connecting the first region and the second region;
a first silicide-containing portion and a second silicide-containing portion over the silicon-containing line, the first silicide-containing portion being separated from the second silicide-containing portion by a gap; and
an extended silicide-containing portion within the gap, the extended silicide-containing portion extending from the second silicide-containing portion towards the first silicide-containing portion, the extended silicide-containing portion having a first end having a first thickness and a second end having a second thickness, the second end of the extended silicide-containing portion being closer to the second silicide-containing portion than the first end of the extended silicide-containing portion, and the first thickness being thinner than the second thickness.

10. The memory cell of claim 9, wherein the second silicide-containing portion has a first end having a first width and a second end having a second width, the second end of the second silicide-containing portion being closer to the second portion of the silicon-containing layer than the first end of the second silicide-containing portion, and the first width being less than the second width.

11. The memory cell of claim 9, wherein the second silicide-containing portion has tapered sidewalls.

12. The memory cell of claim 9, wherein the first silicide-containing portion has a width less than 1 µm.

13. The memory cell of claim 9, wherein
the first silicide-containing portion and the second silicide-containing portion have a first resistance value therebetween if the extended silicide-containing portion is absent;
the first silicide-containing portion and the second silicide-containing portion have a second resistance value therebetween if the extended silicide-containing portion exists; and
a ratio of the first resistance value to the second resistance value being greater than a predetermined number.

14. The memory cell of claim 13, wherein the predetermined number of the ratio is greater than 30.

15. The memory cell of claim 13, wherein the first resistance value ranges from $2000\Omega$ to $5000\Omega$.

16. A method of programming a memory cell, the method comprising:
if the memory cell is to store a first logical value, converting the memory cell from a high resistance state to a low resistance state, the memory cell comprising:
a silicon-containing line continuously extending between a first region and a second region;
a first silicide-containing portion over the silicon-containing line and adjacent to the first region;
a second silicide-containing portion over the silicon-containing line and adjacent to the second region, the first silicide-containing portion and the second silicide-containing portion being separated by a gap;
the high resistance state corresponding to a first resistance value between the first silicide-containing portion and the second silicide-containing portion;
the low resistance state corresponding to a second resistance value between the first silicide-containing portion and the second silicide-containing portion; and
the first resistance value being greater than the second resistance value; and
if the memory cell is to store a second logical value, keeping the memory cell at the high resistance state.

17. The method of claim 16, wherein the converting the memory cell from the high resistance state to the low resistance state comprises:
forming an extended silicide-containing portion within the gap between the first silicide-containing portion and the second silicide-containing portion of the memory cell.

18. The method of claim 16, wherein a ratio of the first resistance value to the second resistance value is greater than 30.

19. The method of claim 16, wherein the converting the memory cell from the high resistance state to the low resistance state comprises:
causing a current to flow through the first silicide-containing portion and the second silicide-containing portion for a predetermined time period.

20. The method of claim 19, wherein the predetermined time period is greater than 10 ms if the current has a current level less than 0.6 mA.

* * * * *